(12) United States Patent
Seo et al.

(10) Patent No.: US 12,046,466 B2
(45) Date of Patent: Jul. 23, 2024

(54) METHOD AND APPARATUS FOR TREATING SUBSTRATE

(71) Applicant: SEMES CO., LTD., Cheonan-si (KR)

(72) Inventors: Yong-Jun Seo, Hwaseong-si (KR);
Hyun Yoon, Hwaseong-si (KR);
Jungsuk Goh, Hwaseong-si (KR);
Byeong Geun Kim, Incheon (KR);
Yoonki Sa, Seoul (KR); Doyeon Kim,
Yongin-si (KR); Yerim Yeon,
Hwaseong-si (KR); Choonghyun Lee,
Hwaseong-si (KR); Pil Kyun Heo,
Hwaseong-si (KR); Youngje Um,
Busan (KR); Jaeseong Lee,
Hwaseong-si (KR); Dongok Ahn,
Anyang-si (KR)

(73) Assignee: SEMES CO., LTD.,
Chungcheongnam-Do (KR)

( * ) Notice: Subject to any disclaimer, the term of this patent is extended or adjusted under 35 U.S.C. 154(b) by 0 days.

(21) Appl. No.: 17/965,911

(22) Filed: Oct. 14, 2022

(65) Prior Publication Data
US 2023/0044888 A1 Feb. 9, 2023

Related U.S. Application Data

(63) Continuation of application No. 16/993,442, filed on Aug. 14, 2020.

(30) Foreign Application Priority Data

Aug. 14, 2019 (KR) .................... 10-2019-0099686

(51) Int. Cl.
*H01L 21/02* (2006.01)
*H01L 21/67* (2006.01)

(52) U.S. Cl.
CPC .... *H01L 21/02101* (2013.01); *H01L 21/6715* (2013.01)

(58) Field of Classification Search
CPC .................. H01L 21/02101; H01L 21/615
See application file for complete search history.

(56) References Cited

U.S. PATENT DOCUMENTS

2003/0198895 A1 10/2003 Toma et al.
2005/0191865 A1 9/2005 Jacobson
(Continued)

FOREIGN PATENT DOCUMENTS

JP 2004-363404 A 12/2004
JP 2012-94848 A 5/2012
(Continued)

OTHER PUBLICATIONS

Office Action for Korean Application No. 10-2019-0099686 dated Jul. 30, 2020.
(Continued)

*Primary Examiner* — Sharidan Carrillo
(74) *Attorney, Agent, or Firm* — Harness, Dickey & Pierce, P.L.C.

(57) ABSTRACT

The inventive concept provides a method for treating a substrate. In an embodiment, the substrate treating method includes a treatment step of treating a residue on the substrate with a first fluid in a supercritical state and a second fluid in a supercritical state in a process space of a chamber, and the first fluid in the supercritical state and the second fluid in the supercritical state have different densities.

13 Claims, 11 Drawing Sheets

(56) References Cited

U.S. PATENT DOCUMENTS

| | | |
|---|---|---|
| 2007/0151582 A1 | 7/2007 | Kin et al. |
| 2012/0196445 A1 | 8/2012 | Lim |
| 2016/0334162 A1 | 11/2016 | Kim et al. |
| 2017/0098541 A1 | 4/2017 | Gouk et al. |
| 2018/0366348 A1 | 12/2018 | Cho et al. |
| 2021/0023582 A1 | 1/2021 | Heo et al. |
| 2021/0050210 A1 | 2/2021 | Seo et al. |
| 2023/0044888 A1* | 2/2023 | Seo .................. H01L 21/02101 |

FOREIGN PATENT DOCUMENTS

| | | |
|---|---|---|
| JP | 2013-16798 A | 1/2013 |
| KR | 101227760 B1 | 1/2013 |
| KR | 10-2013-0053507 A | 5/2013 |
| KR | 10-2014-0014043 A | 2/2014 |
| KR | 101422332 B1 | 7/2014 |
| KR | 10-2014-0144806 A | 12/2014 |
| KR | 101572746 B1 | 11/2015 |
| KR | 101687201 B1 | 12/2016 |
| KR | 10-2017-0032857 A | 3/2017 |
| KR | 10-2018-0063831 A | 6/2018 |
| KR | 10-2019-0003107 A | 1/2019 |
| KR | 10-2019-0041158 A | 4/2019 |
| KR | 10-20199529 B1 | 9/2019 |
| KR | 102105164 B1 | 6/2020 |

OTHER PUBLICATIONS

Japanese Office Action dated Nov. 15, 2022 issued in Japanese Patent Application No. 2020-136936.

Japanese Notice of Allowance dated Jun. 6, 2023 issued in Japanese Patent Application No. 2020-136936.

\* cited by examiner

METHOD AND APPARATUS FOR TREATING SUBSTRATE

CROSS-REFERENCE TO RELATED APPLICATIONS

This application is a continuation of U.S. application Ser. No. 16/993,442, filed on Aug. 14, 2020, which claims priority under 35 U.S.C. § 119 to Korean Patent Application No. 10-2019-0099686 filed on Aug. 14, 2019, in the Korean Intellectual Property Office, the entire contents of each of which are hereby incorporated by reference.

BACKGROUND

Embodiments of the inventive concept described herein relate to a method and apparatus for treating a substrate, and more particularly, relate to a method and apparatus for treating a substrate using a supercritical fluid.

In general, semiconductor elements are manufactured from a substrate such as a wafer. Specifically, the semiconductor elements are manufactured by forming fine circuit patterns on an upper surface of the substrate through a deposition process, a photolithography process, an etching process, and the like.

Various types of foreign substances adhere to the upper surface of the substrate, on which the circuit patterns are formed, during the processes. Therefore, a cleaning process of removing the foreign substances on the substrate is performed between the processes.

The cleaning process generally includes a chemical processing process of removing the foreign substances on the substrate by dispensing a chemical onto the substrate, a rinsing process of removing the chemical remaining on the substrate by dispensing deionized water onto the substrate, and a drying process of removing the deionized remaining on the substrate.

A supercritical fluid is used to dry the substrate. For example, the deionized water on the substrate is replaced by an organic solvent, and thereafter the supercritical fluid is supplied to the upper surface of the substrate in a high-pressure chamber and dissolves the organic solvent remaining on the substrate to remove the organic solvent from the substrate. In a case where isopropyl alcohol (hereinafter, referred to as the IPA) is used as the organic solvent, carbon dioxide ($CO_2$) that has a relatively low critical temperature and pressure and in which the IPA is dissolved well is used as the supercritical fluid.

The substrate is treated using the supercritical fluid as follows. FIG. 1 represents the pressure P and the temperature T in the chamber when the substrate is treated by using the supercritical fluid. When the substrate is loaded into the high-pressure chamber, the carbon dioxide in a supercritical state is supplied into the high-pressure chamber to pressurize the inside of the high-pressure chamber (S10), and thereafter the substrate is treated with the supercritical fluid while the supply of the supercritical fluid and evacuation of the high-pressure chamber are repeated (S20). After the substrate is completely treated, the pressure in the high-pressure chamber is reduced by evacuating the inside of the high-pressure chamber.

As illustrated in FIG. 2, the solubility of the IPA in the carbon dioxide is lowered as temperature is lowered. Accordingly, the temperature in the chamber is lowered by adiabatic expansion when the inside of the chamber is evacuated while the substrate is treated by repeating the supply of the carbon dioxide and the evacuation of the chamber. Although the temperature in the chamber is not lower than the critical temperature of the carbon dioxide, the solubility of the IPA in the carbon dioxide is lowered as illustrated in FIG. 2 as the temperature in the chamber is lowered. As the solubility is lowered, the IPA in the chamber is left in the form of mist and falls on the substrate to cause a defect in cleaning.

While the pressure in the high-pressure chamber is reduced by evacuating the inside of the high-pressure chamber (S30), the pressure in the chamber is lowered, and the temperature in the chamber is lowered to less than 31 degrees Celsius, which is the critical temperature of the carbon dioxide, by adiabatic expansion. Due to this, a supercritical mixture in the chamber is condensed and falls on the substrate after time t1 elapses.

IPA that is not dissolved in the supercritical fluid and a carbon dioxide mixture adhere to the substrate to cause a pattern leaning phenomenon. In a case of increasing process time to decrease the IPA remaining on the substrate, semiconductor prices may be raised, and yields may be lowered.

In the supercritical process using the carbon dioxide in the supercritical state, the carbon dioxide may experience a phase change due to a change in the pressure or temperature in the chamber. Therefore, the solubility of the IPA in the supercritical fluid may be changed, and the IPA that is not dissolved in the supercritical fluid may still remain on the substrate. In particular, as the high-temperature and high-pressure chamber is opened immediately after the substrate is completely treated, the supercritical fluid may experience a rapid phase change, and the temperature in the chamber may be rapidly changed.

Furthermore, because the supercritical fluid and the IPA are not smoothly released, the supercritical fluid infiltrating deep into the space between the patterns or the IPA dissolved in the supercritical fluid may remain without being released even after the process is completed.

SUMMARY

Embodiments of the inventive concept provide a substrate treating apparatus and method for improving efficiency in treating a substrate using a supercritical fluid.

Embodiments of the inventive concept provide a substrate treating apparatus and method for preventing a rapid phase change of a supercritical fluid by using different types of supercritical fluids when drying a substrate.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, a method for treating a substrate includes a treatment step of treating a residue on the substrate with a first fluid in a supercritical state and a second fluid in a supercritical state in a process space of a chamber, and the first fluid in the supercritical state and the second fluid in the supercritical state have different densities.

In an embodiment, a supply step of supplying the first fluid into the process space and an exhaust step of evacuating the process space may be sequentially repeated a plurality of times in the treatment step, and the second fluid may be supplied in the supply step.

In an embodiment, a supply step of supplying the first fluid into the process space and an exhaust step of evacuating the process space may be sequentially repeated a plurality of times in the treatment step, and the second fluid may be supplied in the supply step and the exhaust step.

In an embodiment, the method may further include a depressurization step of reducing pressure in the process space by evacuating the process space after the treatment step, and the second fluid may be supplied into the process space during the depressurization step.

In an embodiment, an amount of the second fluid supplied into the process space per unit time may be smaller than amounts of the first fluid and the second fluid discharged from the process space per unit time.

In an embodiment, the method may further include an opening step of opening the chamber after the depressurization step, and the second fluid in a gaseous state may be supplied into the process space during the opening step.

In an embodiment, a supply step of supplying the first fluid or the second fluid and an exhaust step of evacuating the process space after the supply step may be alternately performed a plurality of times in the treatment step, and the supply step may include a first supply step of supplying only the first fluid and a second supply step of supplying only the second fluid.

In an embodiment, the first supply step may be continuously performed N times, and the second supply step may be continuously performed M times, N being a number larger than M.

In an embodiment, as the number of times that the supply step is repeated increases, N may gradually decrease and M may gradually increase.

In an embodiment, as the number of times that the supply step is repeated increases, the amount of the first fluid supplied per unit time in the first supply step may decrease, and the amount of the second fluid supplied per unit time may increase.

In an embodiment, the treatment of the substrate may be a process of removing an organic solvent on the substrate by dissolving the organic solvent on the substrate in the first fluid or the second fluid.

In an embodiment, the first fluid may have a higher density than the second fluid, and the second fluid may have a higher diffusivity than the first fluid.

In an embodiment, the first fluid may be a fluid that dissolves the residue better than the second fluid.

In an embodiment, the second fluid may be a fluid that experiences a phase change into a supercritical state at a lower temperature and a lower pressure than the first fluid.

In an embodiment, the first fluid may be carbon dioxide, and the second fluid may be an inert gas.

In an embodiment, the second fluid may be an argon gas, a nitrogen gas, or a helium gas.

In an embodiment, the first fluid and the second fluid may be the same types of fluids having different densities.

In an embodiment, the first fluid and the second fluid may be carbon dioxide.

In an embodiment, a substrate having patterns formed thereon may be disposed in the process space, the first fluid in the supercritical state may be supplied into the process space to dissolve the residue remaining on the substrate in the first fluid, and the second fluid in the supercritical state may be supplied into the process space to discharge, from the patterns, the first fluid that remains between the patterns and in which the residue is dissolved. The first fluid may have a higher density than the second fluid, and the second fluid may have a higher diffusivity than the first fluid.

In an embodiment, a supply step of supplying the first fluid into the process space and an exhaust step of evacuating the process space may be sequentially repeated a plurality of times, and the evacuation may be performed in a lower direction from the process space.

In an embodiment, the first fluid and the second fluid may be simultaneously supplied into the process space.

In an embodiment, the first fluid and the second fluid may be alternately supplied into the process space.

In an embodiment, the treatment of the substrate may be performed by sequentially repeating the supply of the first fluid into the process space and the evacuation of the process space a plurality of times, and as the number of repetitions increases, an amount of the first fluid supplied per unit time may decrease, and an amount of the second fluid supplied per unit time may increase.

In an embodiment, the treatment of the substrate may be a process of removing an organic solvent on the substrate by dissolving the organic solvent on the substrate in the first fluid or the second fluid.

In an embodiment, the first fluid may have a higher density than the second fluid, and the second fluid may have a higher diffusivity than the first fluid.

In an embodiment, the first fluid may be a fluid that dissolves the residue better than the second fluid.

In an embodiment, the second fluid may be a fluid that experiences a phase change into a supercritical state at a lower temperature and a lower pressure than the first fluid.

In an embodiment, the first fluid and the second fluid may be the same types of fluids having different densities.

According to an exemplary embodiment, an apparatus for treating a substrate includes a chamber having a process space therein, a support unit that supports the substrate in the process space, a first supply unit that supplies a first fluid in a supercritical state into the process space, a second supply unit that supplies a second fluid in a supercritical state into the process space, and an exhaust unit that evacuates the process space. The second fluid may be a fluid that experiences a phase change into a supercritical state at a lower temperature and a lower pressure than the first fluid.

In an embodiment, the apparatus may further include a third supply unit that supplies the second fluid in a gaseous state into the process space.

In an embodiment, the apparatus may further include a controller that controls the first supply unit and the second supply unit. The controller may control the first supply unit and the second supply unit such that a supply step of supplying the first fluid into the process space and an exhaust step of evacuating the process space are sequentially repeated a plurality of times in a treatment step of treating a residue on the substrate with the first fluid in the supercritical state and the second fluid in the supercritical state in the process space and the second fluid is supplied in the supply step.

In an embodiment, the controller may control the first supply unit and the second supply unit such that the second fluid is supplied in the supply step and the exhaust step.

In an embodiment, the apparatus may further include a controller that controls the first supply unit and the second supply unit. The controller may control the first supply unit and the second supply unit such that a depressurization step of reducing pressure in the process space by evacuating the process space after a treatment step is further included and the second fluid is supplied into the process space during the depressurization step.

In an embodiment, the apparatus may further include a controller that controls the third supply unit. The controller may control the first supply unit, the second supply unit, and the third supply unit such that a treatment step of treating a residue on the substrate with the first fluid in the supercritical state and the second fluid in the supercritical state in the process space, a depressurization step of evacuating the process space, and an opening step of opening the chamber after the depressurization step are included and the second fluid in a gaseous state is supplied into the process space during the opening step.

In an embodiment, the treatment of the substrate may be a process of removing an organic solvent on the substrate by dissolving the organic solvent on the substrate in the first fluid or the second fluid.

In an embodiment, the first fluid may have a higher density than the second fluid, and the second fluid may have a higher diffusivity than the first fluid.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
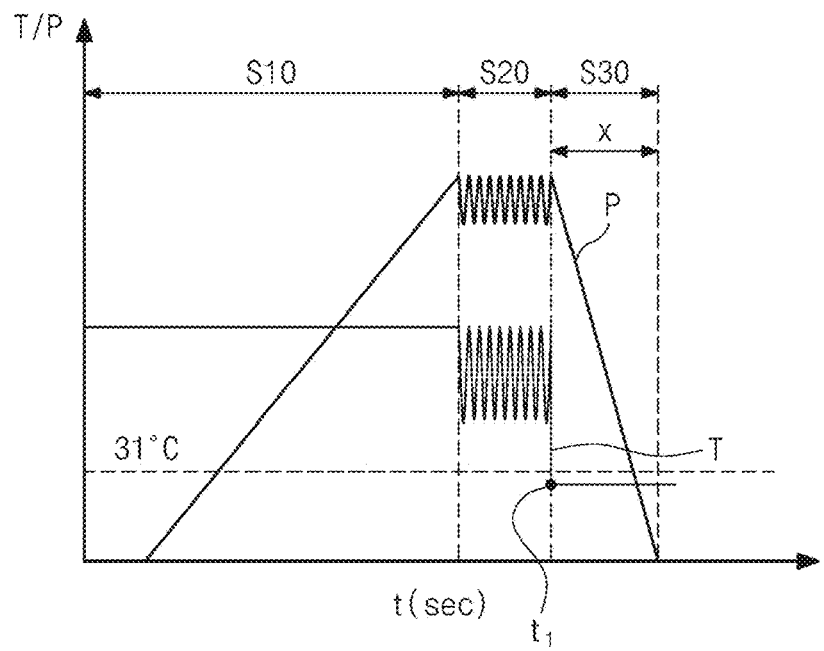
FIG. 1 is a graph illustrating a general supercritical drying process.
Figure 2:
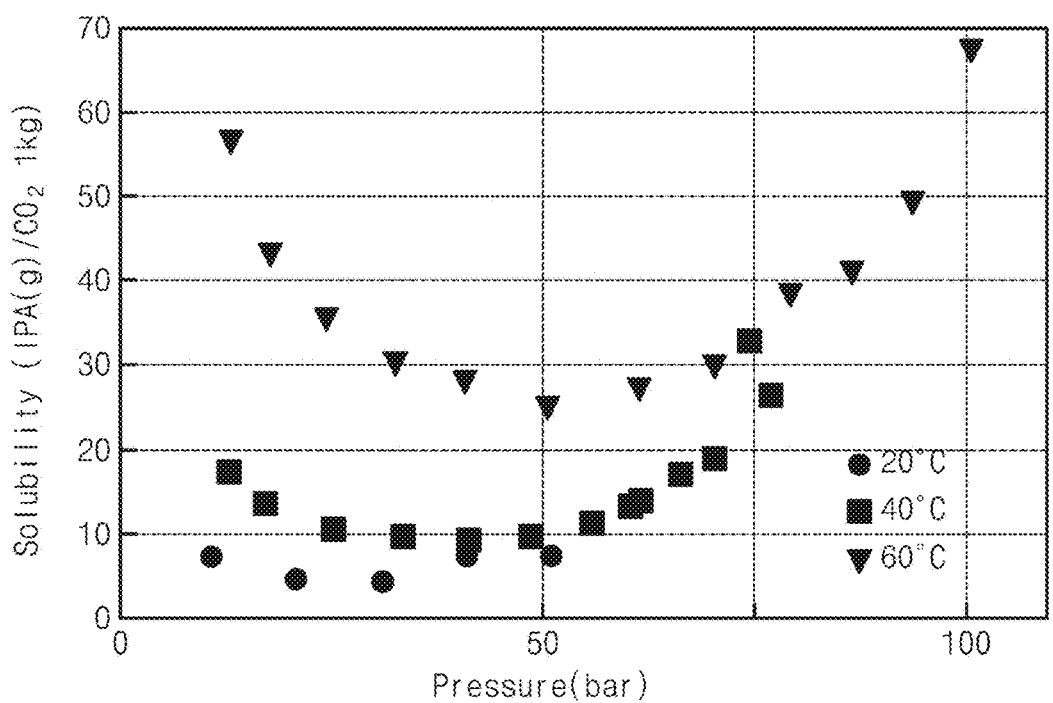
FIG. 2 is a view illustrating the solubility of isopropyl alcohol in carbon dioxide depending on temperature.

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that the inventive concept will be thorough and complete, and will fully convey the scope of the inventive concept to those skilled in the art. In the drawings, the dimensions of components are exaggerated for clarity of illustration.

Figure 3:
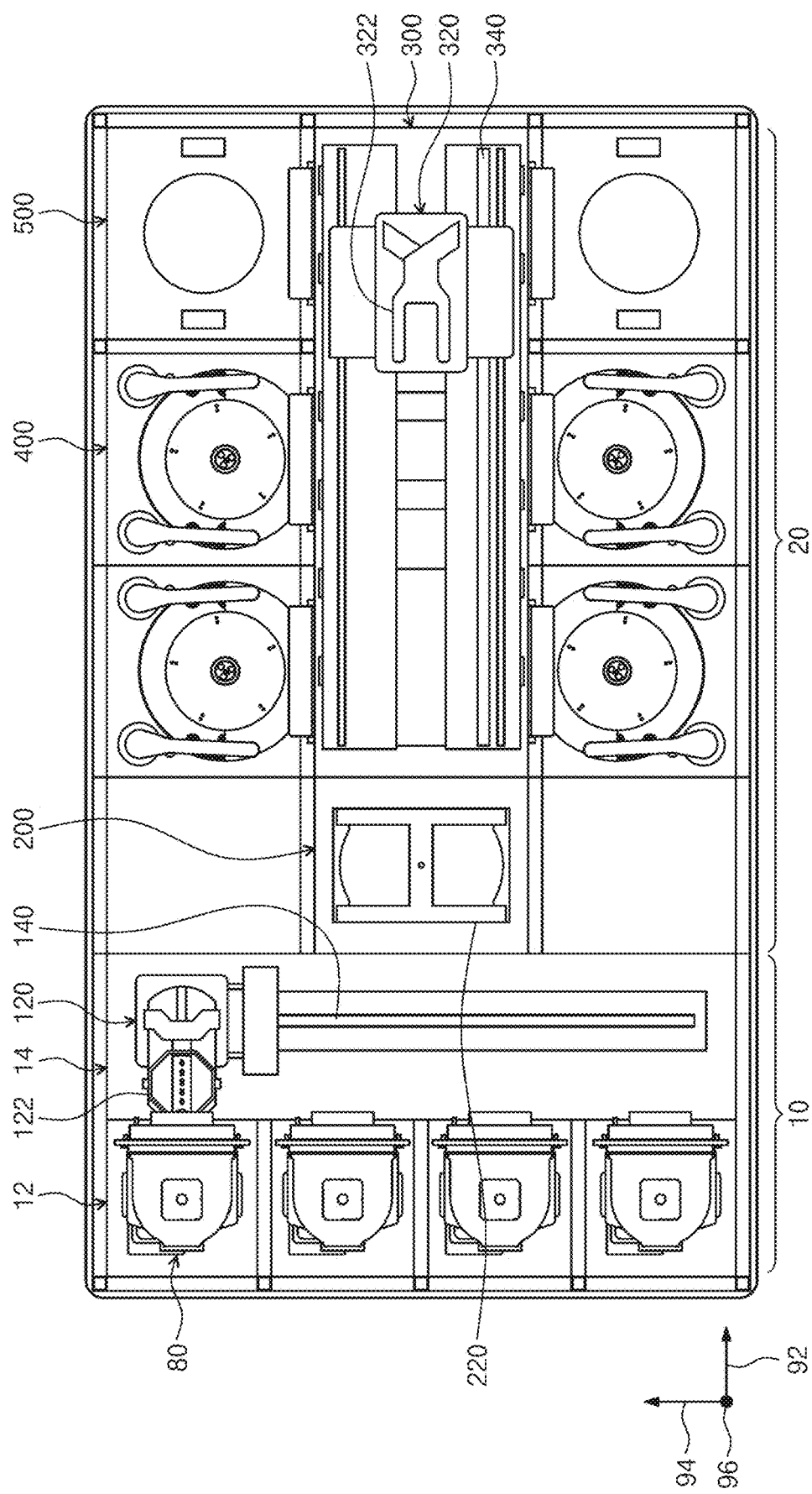
FIG. 3 is a schematic plan view illustrating a substrate treating apparatus according to an embodiment of the inventive concept.

FIG. 3 is a schematic plan view illustrating a substrate treating apparatus according to an embodiment of the inventive concept. Referring to FIG. 3, the substrate treating apparatus includes an index module 10, a process module 20, and a controller (not illustrated). According to an embodiment, the index module 10 and the process module 20 are disposed along one direction. Hereinafter, the direction in which the index module 10 and the process module 20 are disposed is referred to as a first direction 92, a direction perpendicular to the first direction 92 when viewed from above is referred to as a second direction 94, and a direction perpendicular to both the first direction 92 and the second direction 94 is referred to as a third direction 96.

The index module 10 transfers substrates W from carriers 80, in which the substrates W are received, to the process module 20 and places, in the carriers 80, the substrates W completely treated in the process module 20. The lengthwise direction of the index module 10 is parallel to the second direction 94. The index module 10 has load ports 12 and an index frame 14. The load ports 12 are located on the opposite side to the process module 20 with respect to the index frame 14. The carriers 80 having the substrates W received therein are placed on the load ports 12. The plurality of load ports 12 may be disposed along the second direction 94.

Airtight carriers, such as front open unified pods (FOUPs), may be used as the carriers 80. The carriers 80 may be placed on the load ports 12 by a transfer unit (not illustrated) such as an overhead transfer, an overhead conveyor, or an automatic guided vehicle, or by an operator.

An index robot 120 is provided in the index frame 14. A guide rail 140, the lengthwise direction of which is parallel to the second direction 94, is provided in the index frame 14 and the index robot 120 is movable on the guide rail 140. The index robot 120 includes hands 122 on which the substrates W are placed, and the hands 122 are movable forward and backward, rotatable about an axis facing in the third direction 96, and movable along the third direction 96. The hands 122 may be spaced apart from each other in the vertical direction. The hands 122 may independently move forward and backward.

The process module 20 includes a buffer unit 200, a transfer apparatus 3M), liquid treatment apparatuses 400, and supercritical apparatuses 500. The buffer unit 200 provides a space in which the substrates W to be loaded into the process module 20 and the substrates W to be unloaded from the process module 20 temporarily stay. Each of the liquid treatment apparatuses 400 performs a liquid treatment process of treating the substrate W by dispensing a liquid onto the substrate W. Each of the supercritical apparatuses 500 performs a drying process of removing the liquid remaining on the substrate W. The transfer apparatus 3M) transfers the substrates W between the buffer unit 200, the liquid treatment apparatuses 400, and the supercritical apparatuses 500.

The transfer apparatus 300 may be disposed such that the lengthwise direction thereof is parallel to the first direction 92. The buffer unit 200 may be disposed between the index module 10 and the transfer apparatus 300. The liquid treatment apparatuses 400 and the supercritical apparatuses 500 may be disposed on opposite sides of the transfer apparatus 300. The liquid treatment apparatuses 400 and the transfer apparatus 300 may be disposed along the second direction 94. The supercritical apparatuses 500 and the transfer apparatus 300 may be disposed along the second direction 94. The buffer unit 200 may be located at one end of the transfer apparatus 300.

According to an embodiment, the liquid treatment apparatuses 400 may be disposed on the opposite sides of the transfer apparatus 300. The supercritical apparatuses 500 may be disposed on the opposite sides of the transfer apparatus 300. The liquid treatment apparatuses 400 may be disposed closer to the buffer unit 200 than the supercritical apparatuses 500. On one side of the transfer apparatus 300, the liquid treatment apparatuses 400 may be provided in an A×B array (A and B being natural numbers of 1 or larger) along the first direction 92 and the third direction 96. Furthermore, on the one side of the transfer apparatus 300, the supercritical apparatuses 500 may be provided in a C×D array (C and D being natural numbers of 1 or larger) along the first direction 92 and the third direction 96. Alternatively, only the liquid treatment apparatuses 400 may be provided on the one side of the transfer apparatus 300, and only the supercritical apparatuses 500 may be provided on the opposite side of the transfer apparatus 300.

The transfer apparatus 300 has a transfer robot 320. A guide rail 340, the lengthwise direction of which is parallel to the first direction 92, may be provided in the transfer apparatus 300, and the transfer robot 320 is movable on the guide rail 340. The transfer robot 320 includes hands 322 on which the substrates W are placed. The hands 322 are movable forward and backward, rotatable about an axis facing in the third direction 96, and movable along the third direction 96. The hands 322 may be spaced apart from each other in the vertical direction. The hands 322 may independently move forward and backward.

The buffer unit 200 includes a plurality of buffers 220 in which the substrates W are placed. The buffers 220 may be spaced apart from each other along the third direction 96. A front face and a rear face of the buffer unit 200 are open. The front face is a face that faces the index module 10, and the rear face is a face that faces the transfer apparatus 300. The index robot 120 may approach the buffer unit 200 through the front face, and the transfer robot 320 may approach the buffer unit 200 through the rear face.

Figure 4:
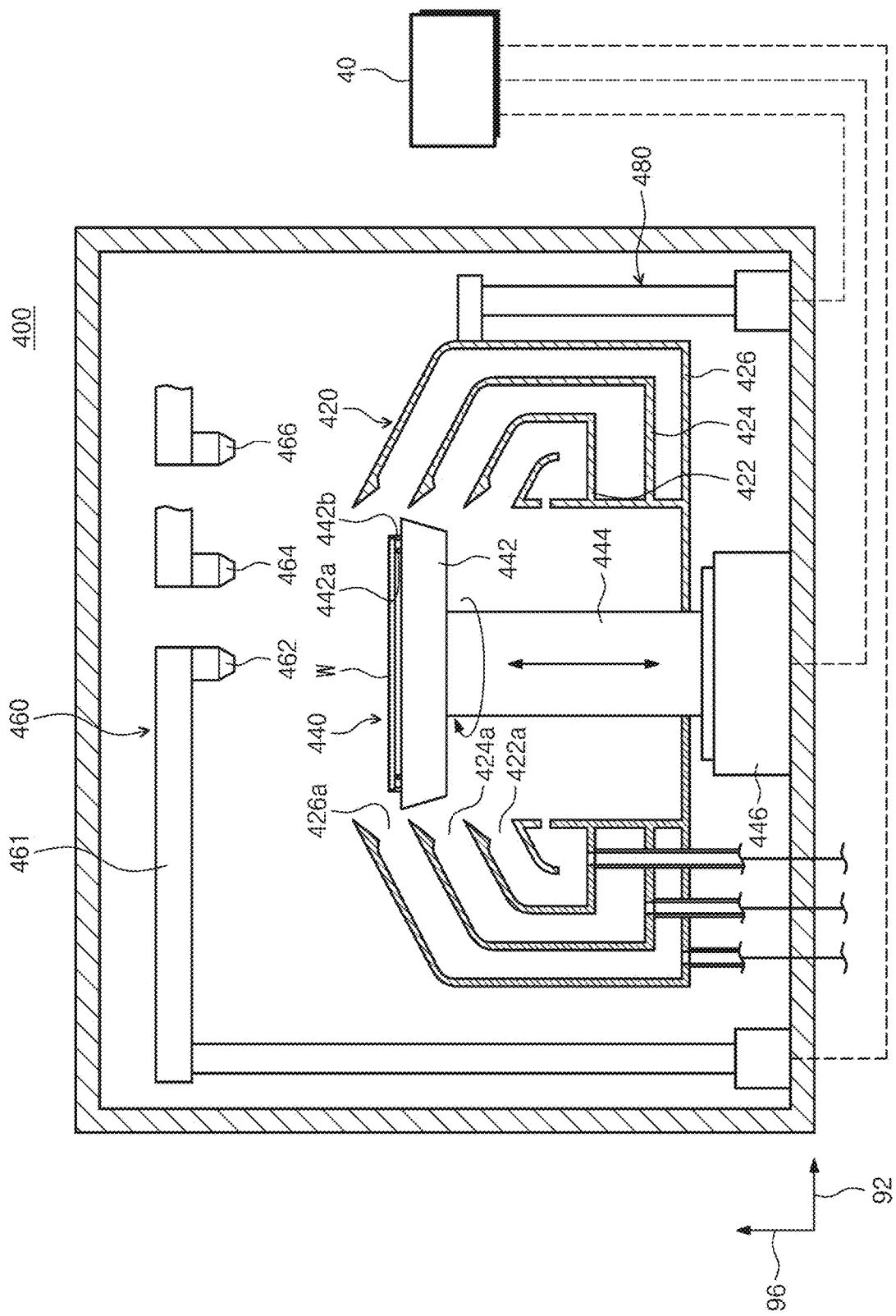
FIG. 4 is a schematic view illustrating one embodiment of liquid treatment apparatuses of FIG. 3.

FIG. 4 is a schematic view illustrating one embodiment of the liquid treatment apparatuses 400 of FIG. 3. Referring to FIG. 4, the liquid treatment apparatus 400 has a housing 410, a cup 420, a support unit 440, a liquid dispensing unit 460, a lifting unit 480, and a controller 40. The controller 40 controls operations of the liquid dispensing unit 460, the support unit 440, and the lifting unit 480. The housing 410 has a substantially rectangular parallelepiped shape. The cup 420, the support unit 440, and the liquid dispensing unit 460 are disposed in the housing 410.

The cup 420 has a process space that is open at the top, and the substrate W is treated with a liquid in the process space. The support unit 440 supports the substrate W in the process space. The liquid dispensing unit 460 dispenses the liquid onto the substrate W supported on the support unit 440. A plurality of types of liquids may be sequentially dispensed onto the substrate W. The lifting unit 480 adjusts the relative height between the cup 420 and the support unit 440.

According to an embodiment, the cup 420 has a plurality of recovery bowls 422, 424, and 426. The recovery bowls 422, 424, and 426 have recovery spaces for recovering the liquids used to treat the substrate W. The recovery bowls 422, 424, and 426 are provided in a ring shape that surrounds the support unit 440. The treatment liquids scattered by rotation of the substrate W during a liquid treatment process are introduced into the recovery spaces through inlets 422a, 424a, and 426a of the respective recovery bowls 422, 424, and 426. According to an embodiment, the cup 420 has the first recovery bowl 422, the second recovery bowl 424, and the third recovery bowl 426. The first recovery bowl 422 is disposed to surround the support unit 440, the second recovery bowl 424 is disposed to surround the first recovery bowl 422, and the third recovery bowl 426 is disposed to surround the second recovery bowl 424. The second inlet 424a through which a liquid is introduced into the second recovery bowl 424 may be located in a higher position than the first inlet 422a through which a liquid is introduced into the first recovery bowl 422, and the third inlet 426a through which a liquid is introduced into the third recovery bowl 426 may be located in a higher position than the second inlet 424a.

The support unit 440 has a support plate 442 and a drive shaft 444. An upper surface of the support plate 442 may have a substantially circular shape and may have a larger diameter than the substrate W. Support pins 442a are provided on a central portion of the support plate 442 to support the backside of the substrate W. The support pins 442a protrude upward from the support plate 442 to space the substrate W apart from the support plate 442 by a predetermined distance. Chuck pins 442b are provided on a peripheral portion of the support plate 442.

The chuck pins 442b protrude upward from the support plate 442 and support the side of the substrate W to prevent the substrate W from escaping from the support unit 440 when being rotated. The drive shaft 444 is driven by an actuator 446. The drive shaft 444 is connected to the center of a bottom surface of the support plate 442 and rotates the support plate 442 about the central axis thereof.

According to an embodiment, the liquid dispensing unit 460 has a first nozzle 462, a second nozzle 464, and a third nozzle 466. The first nozzle 462 dispenses a first liquid onto the substrate W. The first liquid may be a liquid for removing a film or foreign matter remaining on the substrate W. The second nozzle 464 dispenses a second liquid onto the substrate W. The second liquid may be a liquid that dissolves well in a third liquid. For example, the second liquid may be a liquid that dissolves better in the third liquid than the first liquid. The second liquid may be a liquid for neutralizing the first liquid dispensed onto the substrate W. Furthermore, the second liquid may be a liquid that neutralizes the first liquid and that dissolves better in the third liquid than the first liquid.

According to an embodiment, the second liquid may be water. The third nozzle 466 dispenses the third liquid onto the substrate W. The third liquid may be a liquid that dissolves well in a supercritical fluid that is used in the supercritical apparatuses 500. For example, the third liquid may be a liquid that dissolves better in the supercritical fluid used in the cleaning apparatuses 500 than the second liquid. According to an embodiment, the third liquid may be an organic solvent. The organic solvent may be isopropyl alcohol (IPA). According to an embodiment, the supercritical fluid may be carbon dioxide.

The first nozzle 462, the second nozzle 464, and the third nozzle 466 may be supported on different arms 461. The arms 461 may be independently moved. Selectively, the first nozzle 462, the second nozzle 464, and the third nozzle 466 may be mounted on the same arm and may be simultaneously moved.

The lifting unit 480 moves the cup 420 in the vertical direction. The relative height between the cup 420 and the substrate W is changed by the vertical movement of the cup 420. Accordingly, the recovery bowls 422, 424, and 426 for recovering the treatment liquids may be changed depending on the types of liquids dispensed onto the substrate W, thereby separating and recovering the liquids. Alternatively, the cup 420 may be fixed, and the lifting unit 480 may move the support unit 440 in the vertical direction.

Figure 5:
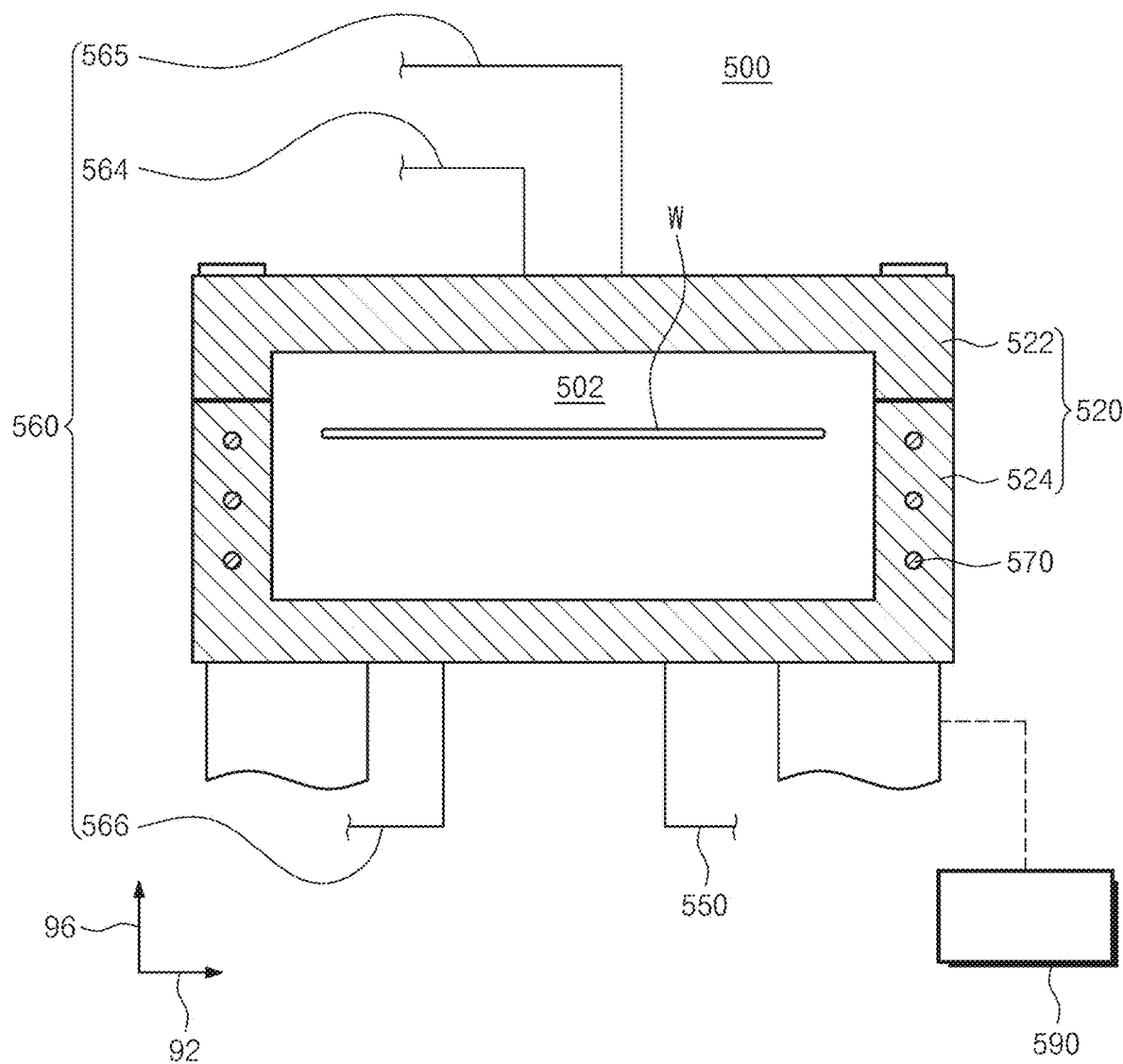
FIG. 5 is a schematic view illustrating one embodiment of supercritical apparatuses of FIG. 3.

FIG. 5 is a schematic view illustrating one embodiment of the supercritical apparatuses 500 of FIG. 3. According to an embodiment, the supercritical apparatus 500 removes a liquid on the substrate W using a supercritical fluid. According to an embodiment, the liquid on the substrate W is IPA. The supercritical fluid may be supplied into the supercritical apparatus 500 to dissolve the IPA on the substrate W and evaporate the IPA from the substrate W, thereby drying the substrate W.

The supercritical apparatus 500 removes the liquid on the substrate W using the supercritical fluid. According to an embodiment, the liquid on the substrate W is isopropyl alcohol (IPA). The supercritical apparatus 500 supplies the supercritical fluid to the substrate W to dissolve the IPA on the substrate W in the supercritical fluid, thereby removing the IPA from the substrate W.

Referring to FIG. 5, the supercritical apparatus 500 includes a process chamber 520, a fluid supply unit 560, a support apparatus 580, and an exhaust line 550.

The process chamber 520 provides a process space 502 in which a cleaning process is performed. The process chamber 520 has an upper housing 522 and a lower housing 524. The upper housing 522 and the lower housing 524 are combined with each other to provide the process space 502 described above. The upper housing 522 is provided over the lower housing 524.

The upper housing 522 may be fixed in position, and the lower housing 524 may be raised or lowered by a drive member 590 such as a cylinder. When the lower housing 524 is spaced apart from the upper housing 522, the process space 502 is opened. At this time, the substrate W is loaded into or out of the process space 502.

During a process, the lower housing 524 is brought into close contact with the upper housing 522 and seals the process space 502 from the outside. A heater 570 is provided inside a wall of the process chamber 520. The heater 570 heats the process space 502 of the process chamber 520 such that the fluid supplied into the inner space of the process chamber 520 is maintained in a supercritical state. An atmosphere by the supercritical fluid is formed in the process space 502.

The support apparatus 580 supports the substrate W in the process space 502 of the process chamber 520. The substrate W loaded into the process space 502 of the process chamber 520 is placed on the support apparatus 580. According to an embodiment, the substrate W is supported by the support apparatus 580 such that a patterned surface faces upward.

The fluid supply unit 560 supplies the supercritical fluid for substrate treatment into the process space 502 of the process chamber 520. According to an embodiment, the fluid supply unit 560 has a main supply line 562, an upper supply line 564, and a lower supply line 566. The upper supply line 564 and the lower supply line 566 branch off from the main supply line 562. The upper supply line 564 may be connected to the center of the upper housing 522. According to an embodiment, the lower supply line 566 may be coupled to the lower housing 524. Furthermore, the exhaust line 550 is coupled to the lower housing 524. The fluid in the process space 502 of the process chamber 520 is discharged outside the process chamber 520 through the exhaust line 550.

Figure 6:
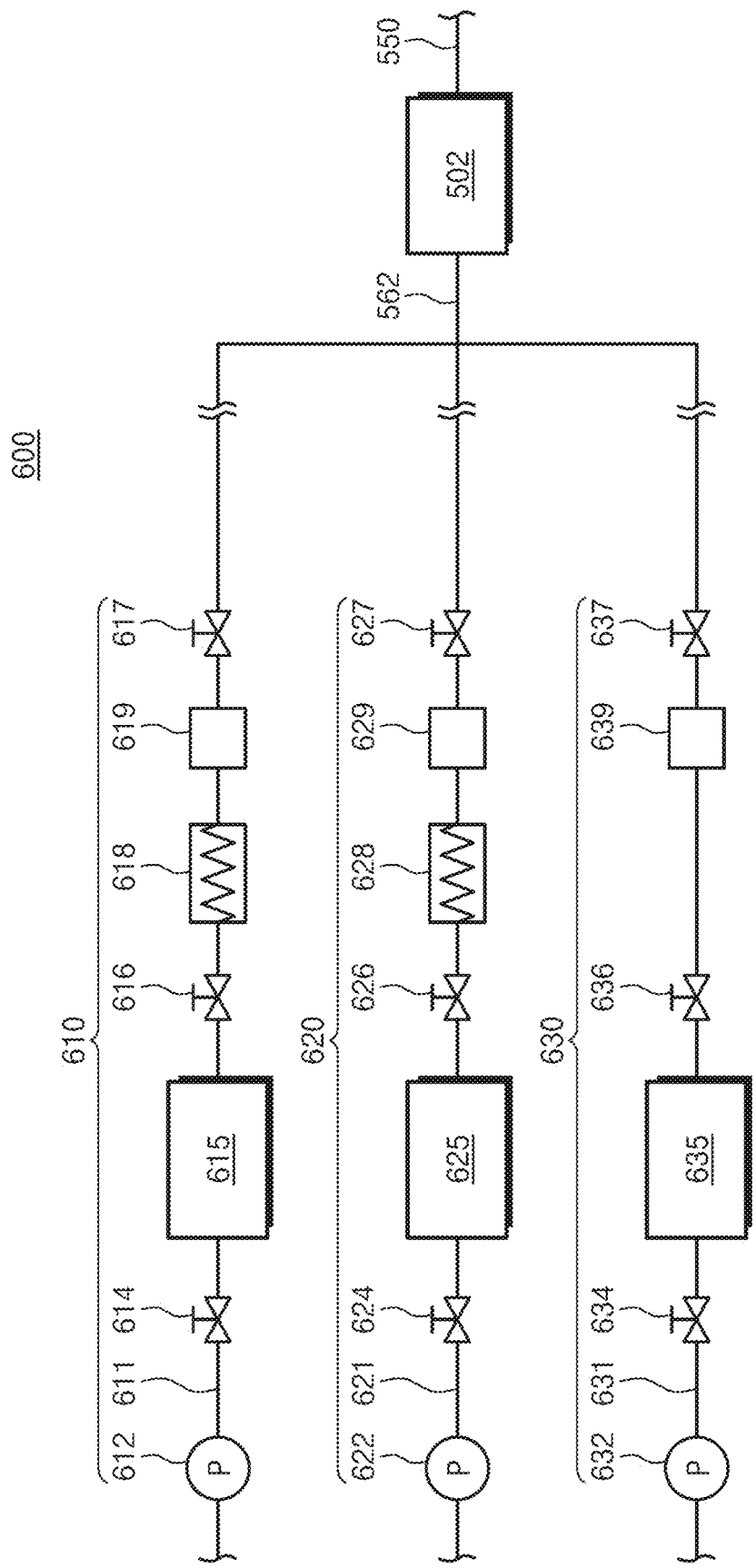
FIG. 6 is a schematic view illustrating one embodiment of a fluid supply unit for supplying a supercritical fluid.

FIG. 6 is a view illustrating an apparatus for treating a substrate according to an embodiment of the inventive concept. Referring to FIG. 6, the substrate treating apparatus of the inventive concept may include a first supply unit 610, a second supply unit 620, a third supply unit 630, and a controller (not illustrated). The controller controls the first supply unit 610, the second supply unit 620, and the third supply unit 630.

The first supply unit 610 supplies a first fluid in a supercritical state into the process space 502. The second supply unit 620 supplies a second fluid in a supercritical state into the process space 502. The third supply unit 630 supplies the second fluid in a gaseous state into the process space 502.

The first supply unit 610 includes a first supply line 611, and a first pump 612, a first front valve 614, a first rear valve 616, a first heater 618, a first filter 619, and a first adjustment valve 617 that are provided on the first supply line 611. The first pump 612 is provided in front of a first reservoir 615 and supplies the first fluid to the first reservoir 615. The first front valve 614 adjusts the flow rate of the first fluid that is supplied from the first pump 612 to the first reservoir 615. The first rear valve 616 adjusts the flow rate of the first fluid that is supplied from the first reservoir 615 to the first heater 618. The first filter 619 is provided downstream of the first heater 618 and removes impurities flowing in the first supply line 611. The first adjustment valve 617 adjusts the flow rate of the first fluid that is supplied from the first supply line 611 into the process space 502.

The second supply unit 620 includes a second supply line 621, a second pump 622, a second front valve 624, a second rear valve 626, a second heater 628, a second filter 629, and a second adjustment valve 627. The second pump 622 is provided in front of a second reservoir 625 and supplies the second fluid to the second reservoir 625. The second front valve 624 adjusts the flow rate of the second fluid that is supplied from the second pump 622 to the second reservoir 625. The second rear valve 626 adjusts the flow rate of the second fluid that is supplied from the second reservoir 625 to the second heater 628. The second filter 629 is provided downstream of the second heater 628 and removes impurities flowing in the second supply line 621. The second adjustment valve 627 adjusts the flow rate of the second fluid that is supplied from the second supply line 621 into the process space 502.

The third supply unit 630 includes a third supply line 631, a third pump 632, a third front valve 634, a third rear valve 636, a third filter 639, and a third adjustment valve 637. The third pump 632 is provided in front of a third reservoir 635 and supplies the second fluid to the third reservoir 635. The third front valve 634 adjusts the flow rate of the second fluid that is supplied from the third pump 632 to the third reservoir 635. The third rear valve 636 adjusts the flow rate of the second fluid that is supplied from the third reservoir 635. The third filter 636 is provided downstream of the third rear valve 636 and removes impurities flowing in the third supply line 631. The third adjustment valve 637 adjusts the flow rate of the second fluid that is supplied from the third supply line 631 into the process space 502.

Hereinabove, it has been described that the third supply unit 630 in FIG. 6 does not include a heater. However, in another embodiment, the third supply unit 630 may include a heater under a condition that the second fluid is supplied at a temperature lower than the critical temperature at which the second fluid is changed into a supercritical state.

In an embodiment, the first supply unit 610, the second supply unit 620, and the third supply unit 630 may be connected to the main supply line 562 of the fluid supply unit 560.

Figure 7:
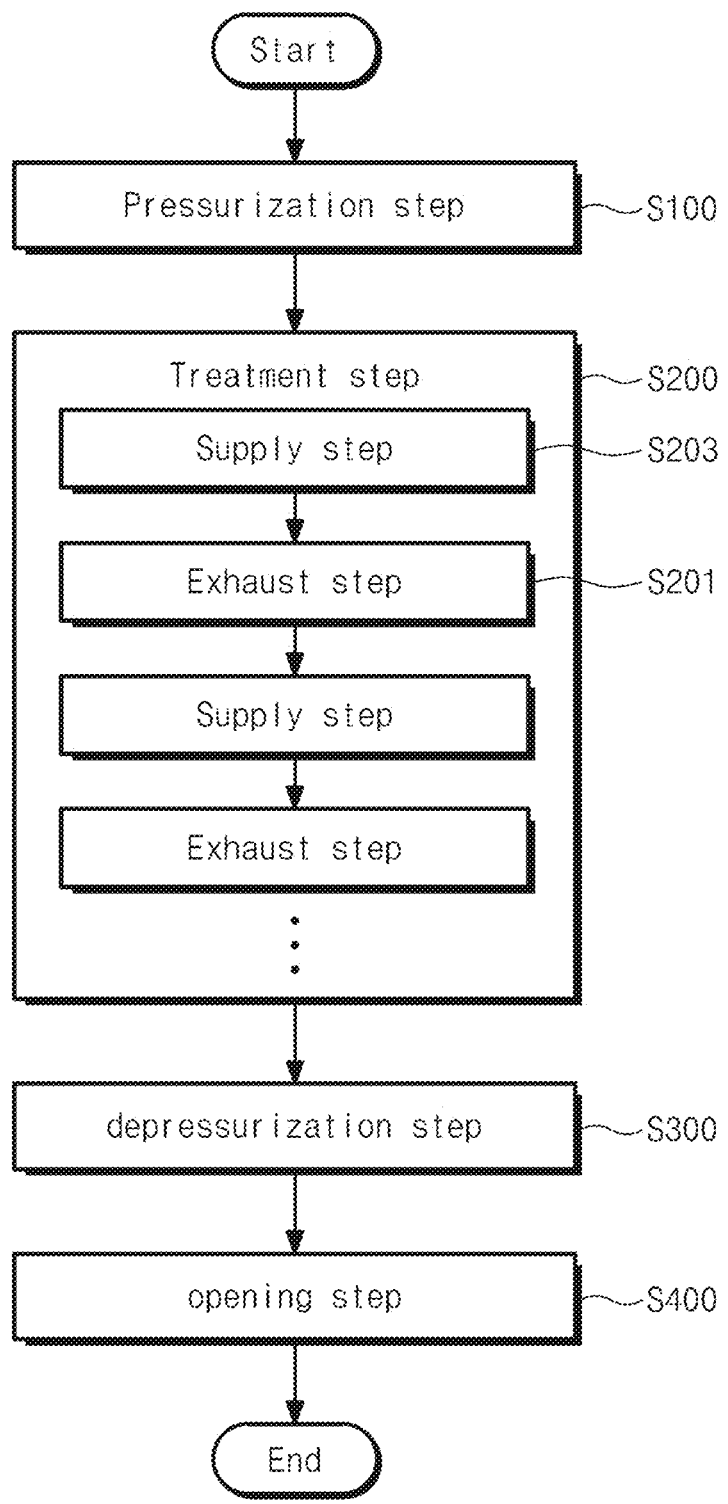
FIG. 7 is a flowchart illustrating a substrate treating method according to an embodiment of the inventive concept.
Figure 8:
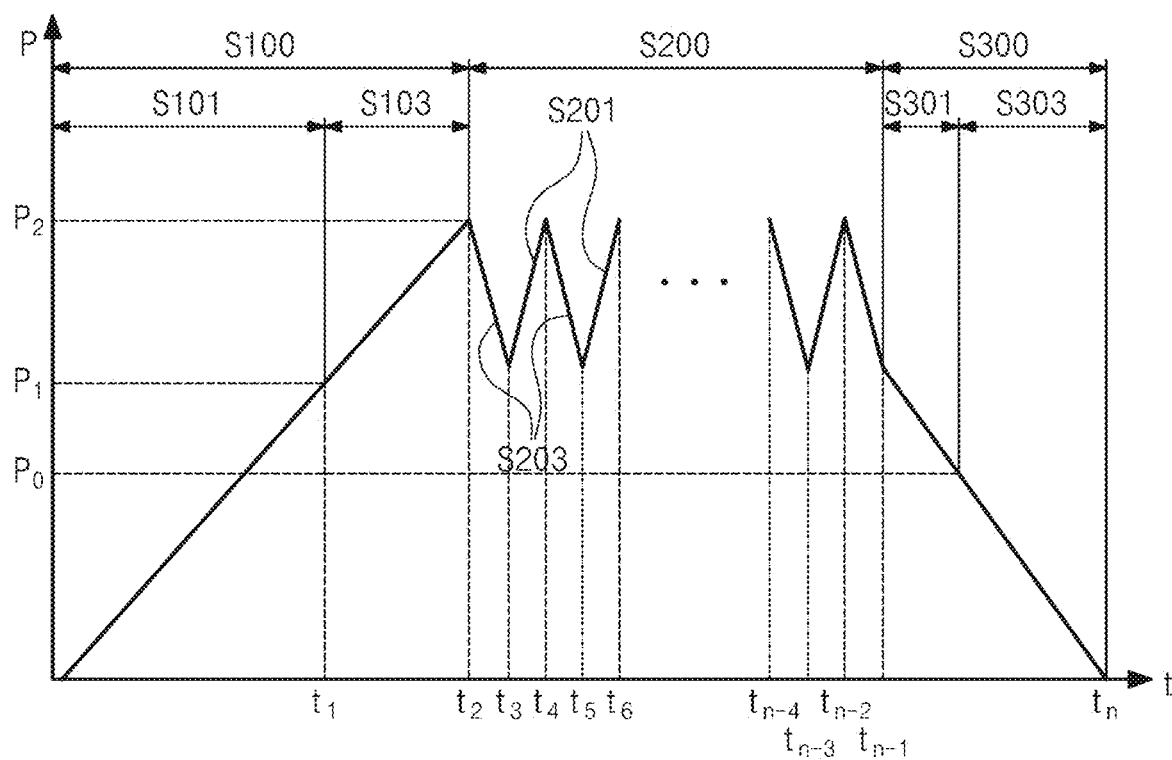
FIG. 8 is a graph depicting a pressure change in a chamber over time.

FIG. 7 is a flowchart illustrating a method for treating a substrate according to the inventive concept, and FIG. 8 is a graph depicting a pressure change in the process chamber 520 of the inventive concept. Referring to FIGS. 7 and 8, the method for treating the substrate may include a pressurization step S100, a treatment step S200, a depressurization step S300, and an opening step S400.

The pressurization step S100 is performed when the substrate is loaded into the process space 502. In the pressurization step S100, the first fluid in the supercritical state is supplied into the process space 502 to pressurize the process space 502. The pressurization is performed until the pressure in the process space 502 reaches more than the critical pressure at which the first fluid is changed into a supercritical fluid.

In the treatment step S200, the substrate is treated by supplying the first fluid in the supercritical state into the process space 502. The treatment step S200 includes a supply step S201 and an exhaust step S203. The supply step S201 and the exhaust step S203 are sequentially repeated a plurality of times. In the supply step S201, the first fluid is supplied into the process space 502, and in the exhaust step S203, the process space 502 is evacuated.

In the depressurization step S300, the process space 502 is evacuated after the substrate is completely treated. According to an embodiment, the depressurization is performed until the pressure in the process space 502 reaches the atmospheric pressure or a pressure similar thereto. After the depressurization step S300 is completed, the opening step S400 of opening the chamber is performed, and when the chamber is open, the substrate is unloaded from the process space 502.

As described above, in the pressurization step S100 and the treatment step S200, the first fluid in the supercritical state is supplied into the process space 502. In at least one of the treatment step S200, the depressurization step S300, or the opening step S400, the second fluid is supplied into the process space 502. The first fluid and the second fluid may be alternately supplied.

The second fluid supplied into the process space 502 has a different density from the first fluid. The first fluid may have a higher density than the second fluid, and the second fluid may have a higher diffusivity than the first fluid. The first fluid may dissolve a residue better than the second fluid. For example, the residue is IPA that is an organic solvent.

Hereinafter, it will be exemplified that the first fluid is carbon dioxide and the second fluid is nitrogen. After the pressurization step S100 is performed, nitrogen in a supercritical state, together with carbon dioxide in a supercritical state, is supplied into the process space 502 in the supply step S201.

The supply step S201 includes a first supply step S211 and a second supply step S221. In the first supply step S211, only the carbon dioxide is supplied into the process space 502, and the nitrogen is not supplied. In the second supply step S221, only the nitrogen is supplied into the process space 502, and the carbon dioxide is not supplied. In an embodiment, the amount of the first fluid supplied into the process space 502 per unit time in the first supply step S211 is the same as the amount of the second fluid supplied into the process space 502 per unit time in the second supply step S221.

The first supply step S211 may be continuously performed N times, and the second supply step S221 may be continuously performed N times. N may be a number larger than M. In an embodiment, in the supply step S201, the carbon dioxide is continuously supplied into the process space 502 rive times, and in the following supply step S201, the nitrogen is supplied into the process space 502 once. A process in which in the following supply step S201, the carbon dioxide is supplied into the process space 502 five times and in the following supply step S201, the nitrogen is supplied into the process space 502 once may be repeated.

With an increase in the number of times that the supply unit S201 is repeated. N may gradually decrease, and M may gradually increase. In an embodiment, in the supply step S201, the carbon dioxide is continuously supplied into the process space 502 five times, and in the following supply step S201, the nitrogen is supplied into the process space 502 once. In the following supply step S201, the carbon dioxide is supplied into the process space 502 four times, and in the following supply step S201, the nitrogen is supplied into the process space 502 twice.

As the number of times that the supply step S201 is repeated increases. N gradually decreases, and M gradually increases. However, N remains larger than M such that the total amount of the carbon dioxide supplied in the supply step S201 is larger than the total amount of the nitrogen.

Figure 9:
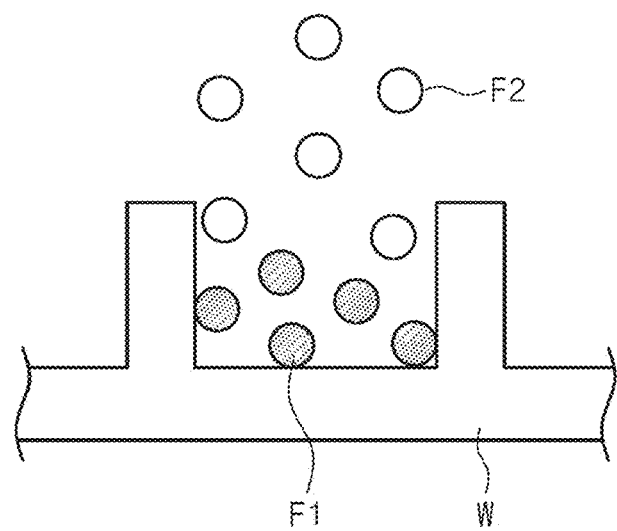
FIGS. 9 to 12 illustrate behaviors of a first fluid F1 and a second fluid F2 between patterns formed on a substrate.

FIGS. 9 to 12 illustrate behaviors of the first fluid F1 and the second fluid F2 between patterns formed on the substrate. Referring to FIG. 9, when the first fluid F1 is supplied into the process space 502, the first fluid F1 having a relatively high density sinks between the patterns. At this time, IPA dissolved in the first fluid F1 exists between the patterns.

Figure 10:
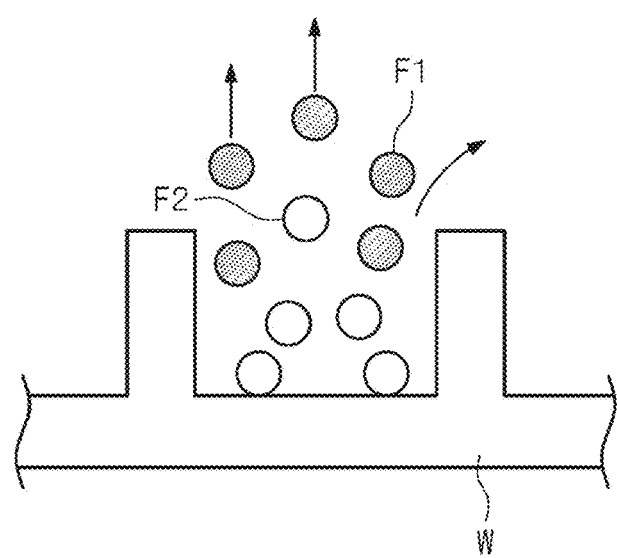
Figure 11:
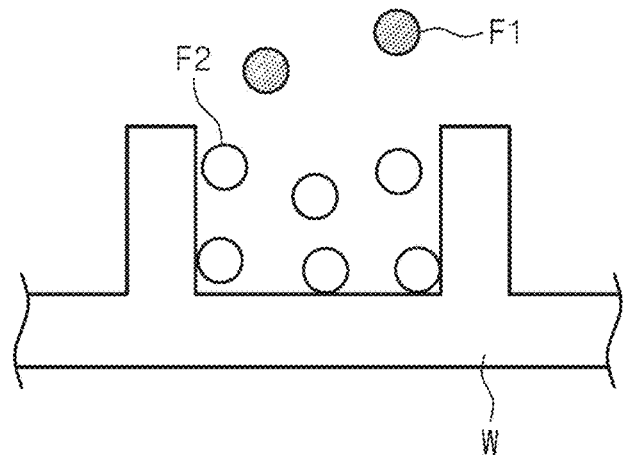

The second fluid F2 is supplied into the process space 502. Referring to FIG. 10, the second fluid F2 pushes the first fluid F1 between the patterns because the second fluid F2 has a lower density and a higher diffusivity than the first fluid F1. At this time, the IPA dissolved in the first fluid F1, together with the first fluid F1, is pushed from between the patterns. Referring to FIG. 11, only the second fluid F2 having a high diffusivity exists between the patterns.

Figure 12:
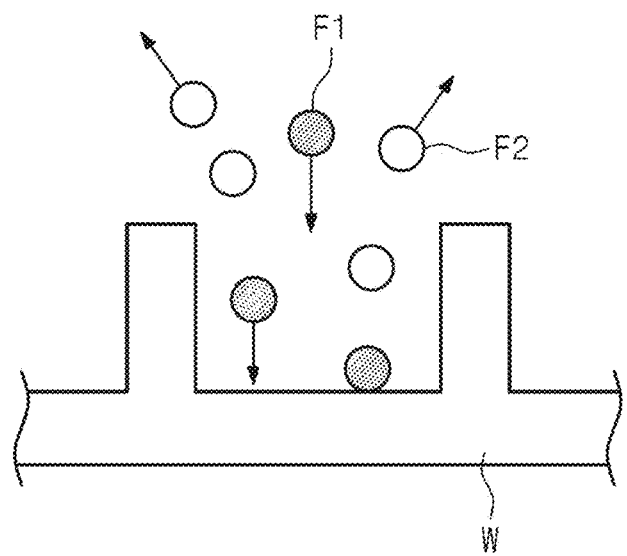

The first fluid F1 is supplied into the process space 502 again. Referring to FIG. 12, due to a difference in density between the first fluid F1 and the second fluid F2, the first fluid F1 having a higher density sinks while pushing the second fluid F2 remaining between the patterns.

By repeating the process of FIGS. 9 to 12, the first fluid and the second fluid may be briskly moved, and thus a stirring effect of stirring the process space 502 may be obtained. The IPA dissolved in the first fluid between the patterns may be effectively released while the process space 501 is agitated by the first fluid and the second fluid.

Furthermore, due to the density difference between the first fluid and the second fluid, the second fluid may infiltrate deep into the space between the patterns and thereafter may be pushed from between the patterns. Accordingly, the IPA may be effectively discharged even in a case where a pattern having a relatively large height is formed.

The second fluid may experience a phase change into a supercritical state at a lower temperature and a lower pressure than the first fluid. The second fluid is supplied into the process space 502 at a temperature and pressure above the temperature and pressure at which the first fluid is changed into a supercritical state. Accordingly, the second fluid in the gaseous state that is introduced into the process space 502 exists in a supercritical state in the process space 502.

Figure 13:
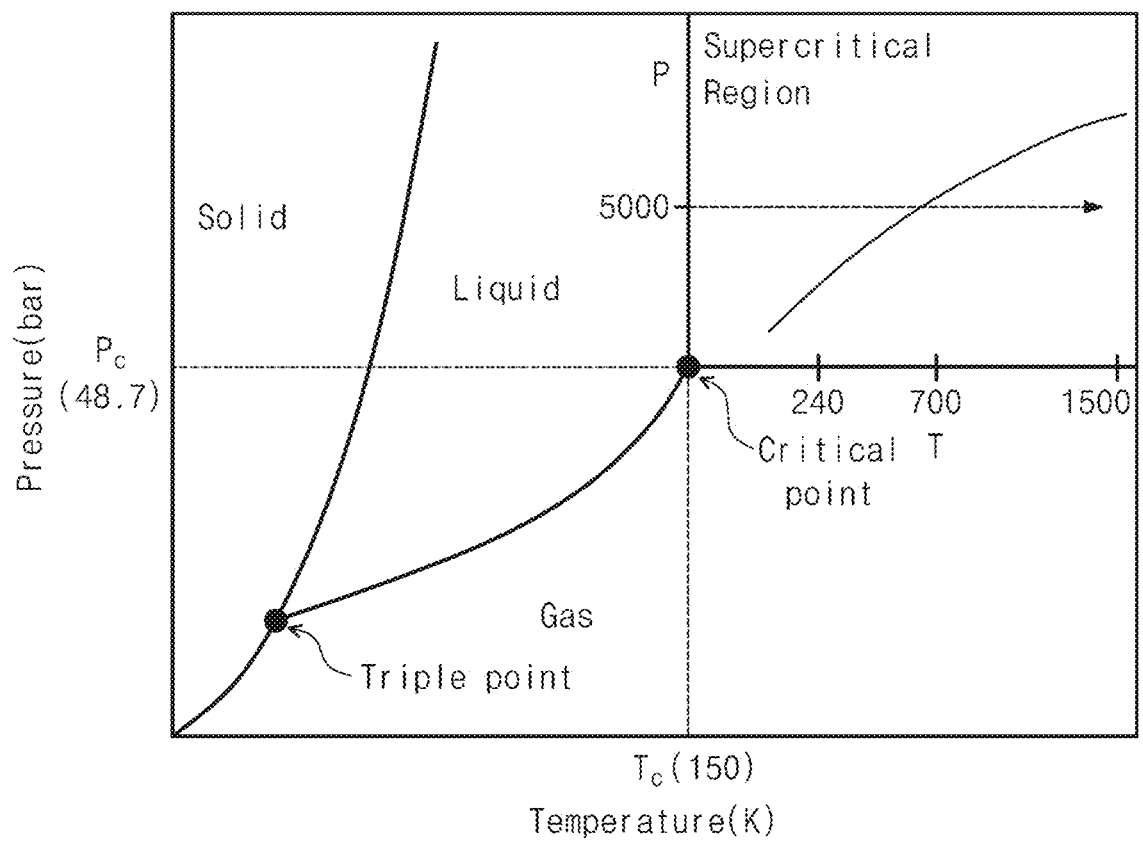
FIGS. 13 and 14 illustrate phase diagrams of argon and nitrogen gases, respectively.
Figure 14:
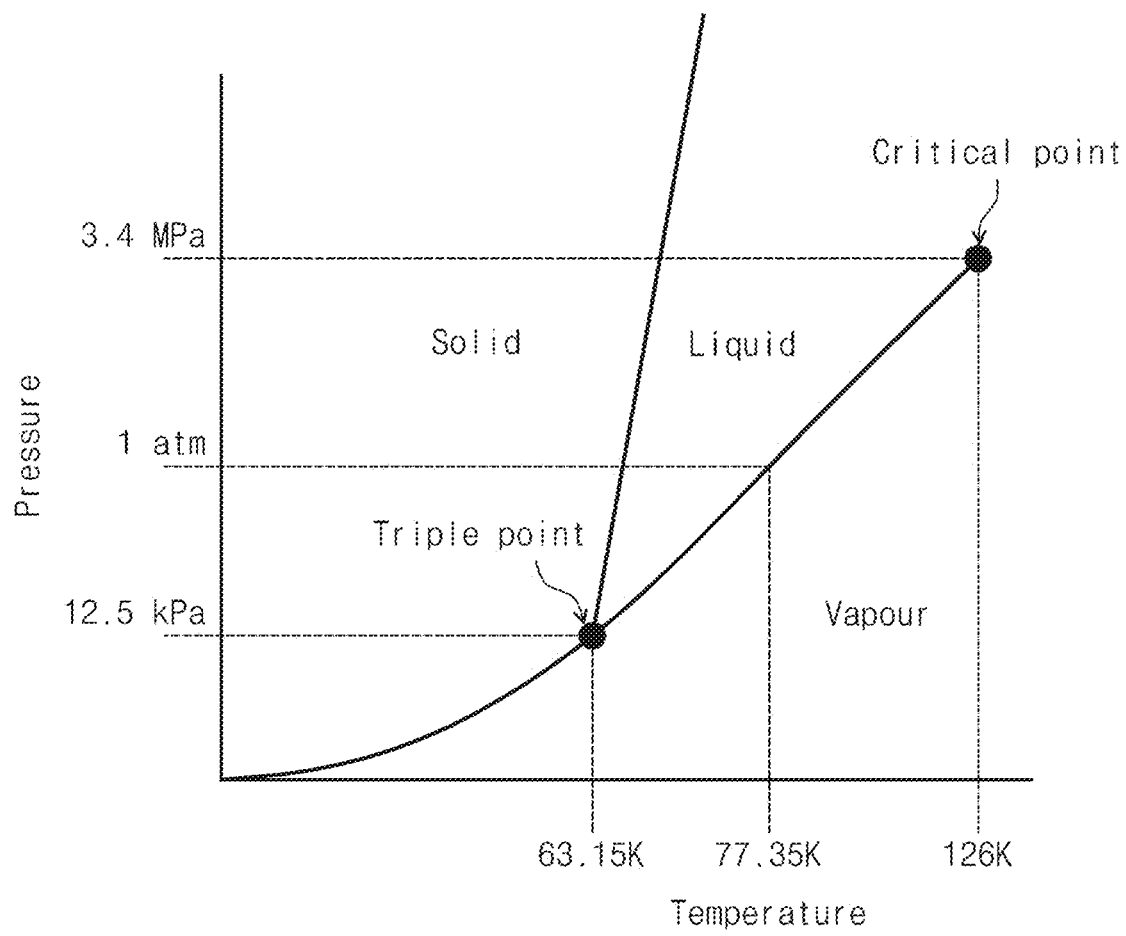

In an embodiment, the first fluid may be carbon dioxide, and the second fluid may be an inert gas. FIGS. 13 and 14 illustrate phase diagrams of argon and nitrogen gases, respectively. Referring to FIGS. 13 and 14, the argon and nitrogen gases experience a phase change into a supercritical state at a lower temperature and a lower pressure than the carbon dioxide. Accordingly, in a case of supplying the argon gas or the nitrogen gas into the process space 502 at a temperature and pressure above the temperature and pressure at which the carbon dioxide is changed into a supercritical state and maintaining the temperature and pressure of the process space 502 such that the carbon dioxide is changed into a supercritical state, the fluid in the process space 502 remains in a supercritical state.

In an embodiment, the second fluid may be an argon gas or a nitrogen gas, or may be a helium gas that experiences a phase change into a supercritical state at a lower temperature and a lower pressure than carbon dioxide, similarly to the argon gas or the nitrogen gas.

In the depressurization step S300, nitrogen in a supercritical state may be supplied into the process space 502. The amount of the nitrogen supplied into the process space 502 per unit time in the depressurization step S300 may be smaller than the amount of fluid discharged from the process space 502 per unit time. Accordingly, in the depressurization step S300, the pressure in the process space 502 may be lowered. In an embodiment, the nitrogen may be continually supplied while the depressurization step S300 is performed.

In the depressurization step S300, the temperature and pressure of the nitrogen supplied may be lowered as time passes, and the nitrogen may be changed into a gaseous state prior to the opening step S400. In a case of supplying the nitrogen in a gaseous state prior to the opening step S400, efficiency in drying the substrate may be improved, and particles may be easily removed.

When the process space 502 is evacuated, the pressure in the process space 502 may be rapidly lowered. Accordingly, the temperature T1 in a conventional process chamber may be rapidly lowered by adiabatic expansion. As the temperature in the process space 502 is lowered, the solubility of IPA in carbon dioxide may be decreased. In a case where the temperature in the process space 502 is lowered to 31 degrees Celsius or less, carbon dioxide in a supercritical state may be changed into a subcritical state. The carbon dioxide in the subcritical state may form a mixture and may contaminate the substrate.

In the depressurization step S300 in which pressure is lowered, different types of supercritical fluids having a temperature and pressure above the critical temperature and pressure of carbon dioxide may be supplied to stably maintain the supercritical environment of the carbon dioxide and maintain the solubility of IPA in the carbon dioxide. Accordingly, the solubility of the IPA in the carbon dioxide may be conserved, and when the pressure in the process space 502 is reduced, the IPA dissolved in the carbon dioxide in the supercritical state may be discharged outside the chamber.

In the opening step S400 after the depressurization step S300, nitrogen in a supercritical state may be supplied into the process space 502. In an embodiment, the nitrogen may be continually supplied while the opening step S400 is performed. In the opening step S400, the nitrogen may be continually supplied to help release of IPA remaining in the process space 502.

Hereinabove, it has been described that the second fluid is supplied in the supply step S201, in which the first supply step S211 is continuously performed N times and the second supply step S221 is continuously performed M times, N being a number larger than M. Alternatively, the first fluid and the second fluid may be alternately supplied. At this time, the amount of the first fluid supplied per unit time may be set to be larger than the amount of the second fluid supplied per unit time. As the supply step S201 is repeated a plurality of times, the amount of the first fluid supplied per unit time may gradually decrease, and the amount of the second fluid supplied per unit time may gradually increase. The amount of the second fluid supplied per unit time may be set so as not to exceed the amount of the first fluid supplied per unit time.

Although it has been described that in the treatment step S200, the second fluid in the supercritical state is supplied in the supply step S201, the second fluid in the supercritical state may be supplied in the exhaust step S203. Selectively, the second fluid in the supercritical state may be continually supplied without a break during the treatment step S200. As time passes, the amount of the second fluid supplied per unit time may increase, the amount of the first fluid supplied per unit time may decrease, and the total amount of carbon dioxide supplied in the treatment step S200 may be larger than the total amount of nitrogen.

Although it has been described that the first fluid is continually supplied while the depressurization step S300 is performed, the first fluid may be intermittently supplied as in the supply step S200.

Although it has been described that the first fluid is continually supplied while the opening step S400 is performed, the first fluid may be intermittently supplied as in the supply step S200.

Although it has been described that the second fluid is supplied in the supply step S201, the depressurization step S300, and the opening step S400, the second fluid may be supplied in at least one of the aforementioned steps.

Although it has been described that the first fluid and the second fluid are of different types, the first fluid and the second fluid may be the same types of fluids having different densities. In an embodiment, the first fluid and the second fluid may be carbon dioxide.

According to the embodiments of the inventive concept, the substrate treating method and apparatus may improve efficiency in treating a substrate using a supercritical fluid.

According to the embodiments of the inventive concept, the substrate treating method and apparatus may prevent contamination of a substrate by a supercritical fluid mixture condensed in a subcritical state as the temperature in the process space is lowered when the process space in the chamber is evacuated.

According to the embodiments of the inventive concept, the substrate treating method and apparatus may prevent a reduction in the solubility of an organic solvent in a supercritical fluid due to a decrease in the temperature of the process space when supplying the supercritical fluid into the process space of the chamber or releasing the supercritical fluid from the process space of the chamber.

According to the embodiments of the inventive concept, the substrate treating method and apparatus may minimize IPA remaining on a substrate when drying the substrate using a supercritical fluid.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefor, it should be understood that the above embodiments are not limiting, but illustrative.

What is claimed is:

1. A method for treating a substrate, the method comprising:

taking in the substrate to a process space in a chamber;

pressurizing the process space by supplying a first fluid in a supercritical state to the process space until a pressure in the process space exceeds a first critical pressure of the first fluid;

subsequent to the pressurizing, treating the substrate by
first-supplying the first fluid in the supercritical state to the process space,
after the first-supplying of the first fluid, second-supplying a second fluid in a supercritical state to the process space, and
exhausting the process space;

depressurizing the process space by supplying a third fluid in a supercritical state; and removing the substrate from the process space, wherein the first critical pressure and a first critical temperature at which a phase of the first fluid changes into the supercritical state are greater than a second critical pressure and a second critical temperature at which a phase of the second fluid changes into the supercritical state, respectively, a third critical pressure and a third critical temperature at which a phase of the third fluid changes into the supercritical state are greater than the first critical pressure and the first critical temperature of the first fluid, respectively, the first-supplying, the second-supplying, and the exhausting are performed as a cycle, the cycle is performed a plurality of times, the first-supplying continues N times within the cycle, the second-supplying continues M times within the cycle, and N is a number which is higher than M, the first fluid in the supercritical state and the second fluid in the supercritical state have different densities from each other, and the first fluid is carbon dioxide.

2. The method for treating the substrate of claim 1, wherein the second fluid in the supercritical state is supplied to the process space in the exhausting as well.

3. The method for treating the substrate of claim 1, wherein the second fluid is supplied to the process space while the depressurizing is performed.

4. The method for treating the substrate of claim 1 further comprising:

opening the chamber after the depressurizing, and wherein the second fluid is supplied in a gaseous state to the process space while the opening is performed.

5. The method for treating the substrate of claim 1, wherein a supply amount per unit time of the first fluid in the first-supplying and a supply amount per unit time of the second fluid in the second-supplying are same.

6. The method for treating the substrate of claim 1, wherein the N gradually reduces and the M gradually increases while the cycle is repeatedly performed.

7. The method for treating the substrate of claim 1, wherein an entirety of the first-supplying is performed before an entirety of the second-supplying within the cycle.

8. The method for treating the substrate of claim 1, wherein the first-supplying and the second-supplying are alternately performed within the cycle.

9. The method for treating the substrate of claim 1, wherein the first fluid dissolves an organic solvent remaining on the substrate, and the second fluid removes the first fluid which has dissolved the organic solvent from the substrate.

10. The method for treating the substrate of claim 1, wherein the first fluid is a liquid capable of dissolving an organic solvent residue remaining on the substrate better than the second fluid.

11. The method for treating the substrate of claim 1, wherein the second fluid has a higher diffusivity than the first fluid.

12. The method for treating the substrate of claim 9, wherein the first fluid has a solubility, which is higher than that of the second fluid, regarding the organic solvent and the second fluid has a diffusivity which is higher than that of the first fluid.

13. The method for treating the substrate of claim 12, wherein the second fluid includes a nitrogen gas or an inert gas.

* * * * *